(12) United States Patent
Brusarosco et al.

(10) Patent No.: US 8,387,452 B2
(45) Date of Patent: Mar. 5, 2013

(54) METHOD AND SYSTEM FOR GENERATING ELECTRICAL ENERGY WITHIN A VEHICLE TYRE

(75) Inventors: Massimo Brusarosco, Milan (IT); Federico Mancosu, Milan (IT)

(73) Assignee: Pirelli Tyre S.p.A., Milan (IT)

( * ) Notice: Subject to any disclaimer, the term of this patent is extended or adjusted under 35 U.S.C. 154(b) by 340 days.

(21) Appl. No.: 12/452,662

(22) PCT Filed: Jul. 18, 2007

(86) PCT No.: PCT/EP2007/006377
§ 371 (c)(1),
(2), (4) Date: Jan. 14, 2010

(87) PCT Pub. No.: WO2009/010081
PCT Pub. Date: Jan. 22, 2009

(65) Prior Publication Data
US 2010/0186493 A1      Jul. 29, 2010

(51) Int. Cl.
*B60C 23/02* (2006.01)
(52) U.S. Cl. .................................... 73/146.5
(58) Field of Classification Search ............ 73/700–756
See application file for complete search history.

(56) References Cited

U.S. PATENT DOCUMENTS

| | | | | |
|---|---|---|---|---|
| 4,504,761 | A * | 3/1985 | Triplett | 310/339 |
| 5,473,938 | A * | 12/1995 | Handfield et al. | 73/146.5 |
| 5,570,286 | A * | 10/1996 | Margolis et al. | 701/36 |
| 7,138,911 | B2 * | 11/2006 | Tyndall | 340/447 |
| 7,493,818 | B2 * | 2/2009 | Nishihara et al. | 73/651 |
| 7,549,327 | B2 * | 6/2009 | Breed | 73/146 |
| 8,011,237 | B2 * | 9/2011 | Gao et al. | 73/146.5 |
| 2003/0209063 | A1 * | 11/2003 | Adamson et al. | 73/146 |
| 2004/0211250 | A1 * | 10/2004 | Adamson et al. | 73/146 |
| 2007/0295069 | A1 * | 12/2007 | Mancosu et al. | 73/146 |

FOREIGN PATENT DOCUMENTS

| | | |
|---|---|---|
| EP | 1 650 057 A2 | 4/2006 |
| WO | WO 2005/042281 A1 | 5/2005 |
| WO | WO 2005/067073 A1 | 7/2005 |
| WO | WO 2006/003052 A1 | 1/2006 |
| WO | WO 2006/003844 A1 | 1/2006 |
| WO | WO 2006/072539 A2 | 7/2006 |

OTHER PUBLICATIONS

International Search Report from the European Patent Office for International Application No. PCT/EP2007/006377, mailed Mar. 25, 2008.

* cited by examiner

*Primary Examiner* — Andre Allen
(74) *Attorney, Agent, or Firm* — Finnegan, Henderson, Farabow, Garrett & Dunner, L.L.P.

(57) ABSTRACT

A tire includes a flexible piezoelectric element associated with an energy storage device (e.g. a capacitor). The flexible piezoelectric element is mounted in cantilever-beam fashion within a housing so that a first end thereof is fixed to the housing. A loading mass is associated with the second end of the flexible piezoelectric element. A small gap is formed between the inner walls of the housing and the outer surface of the loading mass in order to allow limited flexure of the piezoelectric element. The housing, including the piezoelectric element, is mounted in a crown portion of the tire, preferably on the inner surface of the tire. The piezoelectric element flexes under the action of the longitudinal acceleration when the tire rotates. Sufficient electrical power for powering an electronic device included within the tire is obtained, together with a long durability of the piezoelectric element.

31 Claims, 8 Drawing Sheets

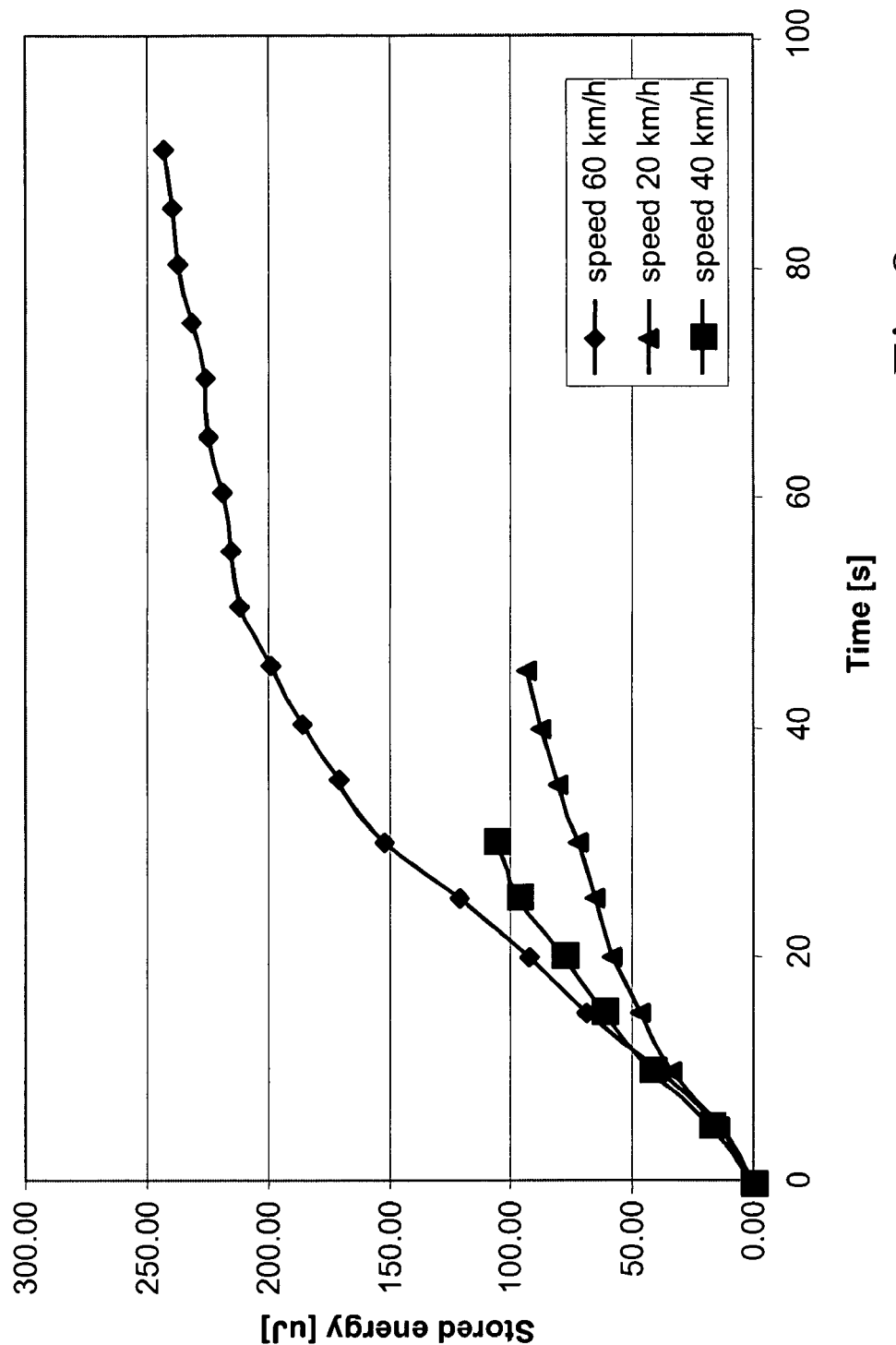

US 8,387,452 B2

METHOD AND SYSTEM FOR GENERATING ELECTRICAL ENERGY WITHIN A VEHICLE TYRE

CROSS REFERENCE TO RELATED APPLICATION

This application is a national phase application based on PCT/EP2007/006377, filed Jul. 18, 2007, the content of which is incorporated herein by reference.

FIELD OF THE INVENTION

The present invention relates to the generation of electrical energy within a vehicle tyre. More specifically, piezoelectric technology is used to convert mechanical strain, due to tyre flexure during rolling, to electric charge, which is stored in an electrical energy storage device, and can thus be made available to a sensor device disposed within the tyre.

BACKGROUND OF THE INVENTION

The incorporation of electronic devices within pneumatic tyres is taking a greater importance in order to increase safety of vehicles. Tyre electronics may include sensors and other components suitable for obtaining information regarding various physical parameters of a tyre, such as for example temperature, pressure, number of tyre revolutions, etc. Such information may become useful in tyre monitoring and/or alarm systems. Furthermore, active control systems of the vehicle may be based on information sent from sensor devices included within the tyres. Typically, wireless transmission is employed in order to send tyre performance information outside the tyre, to a receiver disposed on the vehicle, so that such electronic devices disposed within the tyre typically include a transmitter associated to an antenna. A microprocessor is also typically employed, in order to collect and process the signals coming from the performance sensors, before transmission.

Such integrated tyre electronics have conventionally been powered by a variety of techniques and different power generation systems.

A typical solution for powering tyre electronics systems is the use of a non-rechargeable battery, which may cause inconveniences to a tyre user since proper electronics system operation is dependent on periodic battery replacement. As a matter of fact, batteries tend to deplete their energy storage quite rapidly when powering electronic applications characterized by complex levels of functionality. Furthermore, conventional batteries typically contain heavy metals that are not environmentally friendly and which present disposal concerns, especially when employed in numerous quantity. Moreover, performances of conventional batteries are often influenced by temperature: in particular, the functioning of such batteries is not reliable at low temperatures.

Another known method for powering tyre monitoring systems is a coupling of radio-frequency (RF) power between an antenna disposed on the vehicle in close proximity with an antenna included within the electronic device disposed in the tyre. This typically requires antennas disposed in vehicle portions frequently exposed to damage from road hazards, and thus may be an undesirable solution for powering tyre electronic applications.

The use of piezoelectric elements has also been proposed for powering tyre monitoring systems. Piezoelectricity is a property of certain materials, such as quartz, Rochelle salt, and certain solid-solution ceramic materials such as lead-zirconate-titanate (PZT), of generating electrical charge when mechanically stressed.

PCT patent application WO 2005/067073 discloses a tyre comprising a piezoelectric flexing element associated with an energy storage device (e.g. a capacitor). The piezoelectric flexing element is mounted in cantilever fashion in a housing so as to be positioned substantially along a plane orthogonal to a radial direction of said tyre and so that a first end of the piezoelectric element is restrained to the housing. A loading mass is coupled to the second end of the piezoelectric flexing element. A small gap is formed between the inner walls of the housing and the outer surface of the loading mass, in order to allow limited flexure of the piezoelectric element. The housing including the piezoelectric element is mounted in a tyre portion in correspondence of a tread area of the tyre, preferably on the inner surface of the tyre. The piezoelectric element flexes under the action of the radial acceleration when the tyre rotates. The loading mass and the gap are chosen to obtain: a) small entity oscillations of the flexure element substantially during a complete revolution of the tyre, when the tyre rotates at low speed; b) large entity oscillations of the flexure element substantially only during the passage of the tyre portion including the piezoelectric element in the contact patch.

PCT patent application WO 2006/003052 discloses a piezoelectric generator located on the inside of a tyre, where a piezoelectric flexible beam is mounted on a support. In order to guarantee the freedom of movement of the flexible beam, a housing is positioned over it, whilst a rigid sealing compound mechanically protects the overall arrangement on the inside of the tyre. As a result of the centripetal acceleration variations, the ends of the flexible beam are moved and deform the flexible beam. As a result, electrical energy is generated by the piezoelectric effect.

PCT patent application WO 2006/072539 discloses a configuration of a spring element as a rod spring, torsion spring or leaf spring, in which the free end of the spring element carries a seismic mass, to which an impulse is applied by the rolling of the tyre. The combination of the seismic mass with the spring element produces a spring-mass oscillator. Oscillation is generated by the motion whereby the tyre module, during the rotation of the tyre, describes a straight line as it passes through the contact area, and a circular path as it moves out of the contact area. In the circular path, centrifugal force acts on the seismic mass whereas, under ideal conditions, no force will act on the seismic mass in the contact area. Centrifugal force will displace the spring-mass oscillator, which will then return to its position of rest as it passes through the contact area.

SUMMARY OF THE INVENTION

A piezoelectric element associated with a crown portion of a tyre so as to oscillate according to a radial direction of the tyre as a result of the strong variations of centrifugal force obtained during rolling of the tyre, could provide a sufficient power to be supplied to a sensor device adapted for monitoring at least one tyre parameter, as disclosed in the above mentioned PCT patent application WO 2005/067073.

However, as also disclosed in the above mentioned PCT patent application WO 2005/067073, at a speed higher than a certain threshold the piezoelectric element flexes substantially only during the short passage of its associated tyre portion in the contact patch. The threshold speed could be very low (about 50 km/h). This disadvantageously limits the storable electrical energy generated at each tyre revolution, especially in case the piezoelectric element could oscillate only within a prefixed gap: with such configuration, it has been found that once the threshold speed has been reached, the amount of storable electrical energy generated at each tyre revolution remains substantially constant, whatever the speed.

The Applicant has now found that this drawback could be overcome if the longitudinal acceleration variations experienced by the crown portion of the tyre during rolling are exploited for causing oscillation of a piezoelectric element.

During the passage under the contact patch, crown portions of the tyre are subjected to longitudinal and centrifugal acceleration variations due to the transition from a substantially circumferential shape to a substantially flat shape of the tyre. Longitudinal acceleration variations are weaker than centrifugal acceleration variations, so that a peak of electrical energy generated by oscillation of a flexible piezoelectric element caused by longitudinal acceleration variations could be much lower than a peak of electrical energy generated by oscillation of the same flexible piezoelectric element caused by centrifugal acceleration variations.

However, since the centrifugal acceleration has no effect in the longitudinal direction of the tyre, and since the longitudinal acceleration to which a tyre portion outside the contact patch is subjected is very low (or even null if the tyre rotates at constant speed), a flexible piezoelectric element oscillating under the action of longitudinal acceleration variations could continue to freely oscillate during a whole revolution of the tyre, i.e. not only during the passage of its associated tyre portion under the contact patch. As a result, an overall higher generated electrical energy per tyre revolution could be generated. Furthermore, the overall amount of storable electrical energy generated at each tyre revolution grows with the tyre rotation speed for a much higher range of speeds.

In a first aspect, the invention relates to a method for generating electrical energy within a tyre. The method comprises:
- providing an oscillating structure comprising a housing and a piezoelectric element coupled to said housing and being able to oscillate in an oscillation direction;
- coupling said oscillating structure to a crown portion of said tyre;
- rotating said tyre on a rolling surface so as to cause oscillation of said piezoelectric element, thereby leading to a deformation of said piezoelectric element during the tyre rotation;
- storing electrical energy generated from said deformation of said piezoelectric element;

wherein said coupling of said oscillating structure to a crown portion of said tyre is performed so as to substantially match said oscillation direction with a longitudinal direction of the tyre.

In a second aspect, the invention relates to a system for generating electrical energy. The system comprises:
- a tyre;
- an oscillating structure coupled to a crown portion of said tyre, comprising a housing and a piezoelectric element coupled to said housing and being able to oscillate in an oscillation direction so as to generate electrical energy upon oscillation;
- a storing circuit adapted for storing said electrical energy, coupled to said oscillating structure;

wherein said oscillating structure is coupled to said crown portion of said tyre so as to substantially match said oscillation direction with a longitudinal direction of the tyre.

In a third aspect, the invention relates to a system for monitoring at least one operating parameter of a tyre fitted on a vehicle. The system comprises:
- a system for generating electrical energy according to the above;
- a processing device adapted to process electrical signals generated by the piezoelectric element so as to determine said at least one operating parameter of the tyre.

The present invention, in at least one of the abovementioned aspects, may show one or more of the preferred characteristics hereinafter described.

The piezoelectric element may be coupled to said housing so as to have a first end substantially fixed to the housing and a second end fixed to a loading mass. In such configuration, the center of mass of the oscillating structure could be advantageously shifted towards the second end of the piezoelectric element being free to oscillate, with an effective generation of electrical charge.

A gap could be formed between at least one inner wall of said housing and an outer surface of the loading mass. In such configuration, oscillation of the piezoelectric element could be advantageously limited to a maximum extent, so as to obtain a reliable structure.

The crown portion of the tyre to which the oscillating structure is coupled may be a portion of the inner surface of the tyre. This advantageously facilitates the coupling of the oscillating structure to the tyre.

The coupling of the oscillating structure to the crown portion of the tyre can be performed so as to dispose a longer side of the piezoelectric element substantially according to an axial direction of the tyre. This configuration minimizes the stress to which the piezoelectric element could be subjected during rotation of the tyre, with an advantageous result in terms of reliability.

In order to avoid excessive stress on the piezoelectric element, the loading mass coupled to the second end thereof could be chosen to be lower than 4 grams. The loading mass could be U-shaped, so as to maximize the shifting of the center of mass of the oscillating structure towards the second end of the piezoelectric element.

The gap could have an overall maximum extent of 400 µm, in order to reduce the probability of cracking formation in the piezoelectric element. The "overall maximum extent" of the gap is intended to be the sum of all the distances (in the oscillation direction) between the loading mass sides and the inner walls of the housing when the oscillating structure is at the equilibrium position.

The piezoelectric element could exemplarily be a bimorph element. In preferred embodiments, the piezoelectric element is a planar element.

In preferred embodiments, the oscillating structure could be designed so as to have a resonance peak frequency higher than 150 Hz, more preferably higher than 200 Hz, even more preferably higher than 300 Hz.

The storing circuit of the electrical energy generated by the piezoelectric element typically comprises a capacitor.

Electrical signals generated by the piezoelectric element could be processed so as to extract information related to characteristic peaks of said electrical signals. These characteristic peaks are related to an entering of the crown portion coupled to the oscillating structure in a contact region between the tyre and a rolling surface, and to an exiting of the crown portion coupled to the oscillating structure from said contact region.

For example, the extracted information related to said characteristic peaks could comprise a distance between predetermined points of said characteristic peaks.

As another example, the extracted information related to said characteristic peaks could comprise a sequence of signs of said characteristic peaks. A fitting position of the tyre on the vehicle (right-hand side or left-hand side) could be determined based on said sequence of signs.

A number of tyre revolutions performed by said tyre during rolling in a given time period could also be determined by counting an occurrence of one of said characteristic peaks during said given time period.

A measurement device of at least a further operating parameter of the tyre could also be coupled to the oscillating structure and to the processing device.

Said measurement device could include a pressure sensor, and/or a temperature sensor, and/or an acceleration sensor.

A load to which the tyre is subjected when fitted on a vehicle could be determined based on the distance between said predetermined points of the characteristic peaks and a pressure measured by said pressure sensor.

A transmitter device is also typically coupled to the processing device, for transmitting the at least operating parameter of the tyre determined by the processing device to a receiving device (external to the tyre).

BRIEF DESCRIPTION OF THE DRAWINGS

Further features and advantages of the present invention will be made apparent by the following detailed description of some exemplary embodiments thereof, provided merely by way of non-limiting examples, description that will be conducted by making reference to the attached drawings, wherein:

FIG. 8 shows three curves of stored electrical energy versus time obtained in a test with a flexible piezoelectric element according to FIGS. 3a and 3b.

DETAILED DESCRIPTION OF EXEMPLARY EMBODIMENTS OF THE INVENTION

Figure 1:
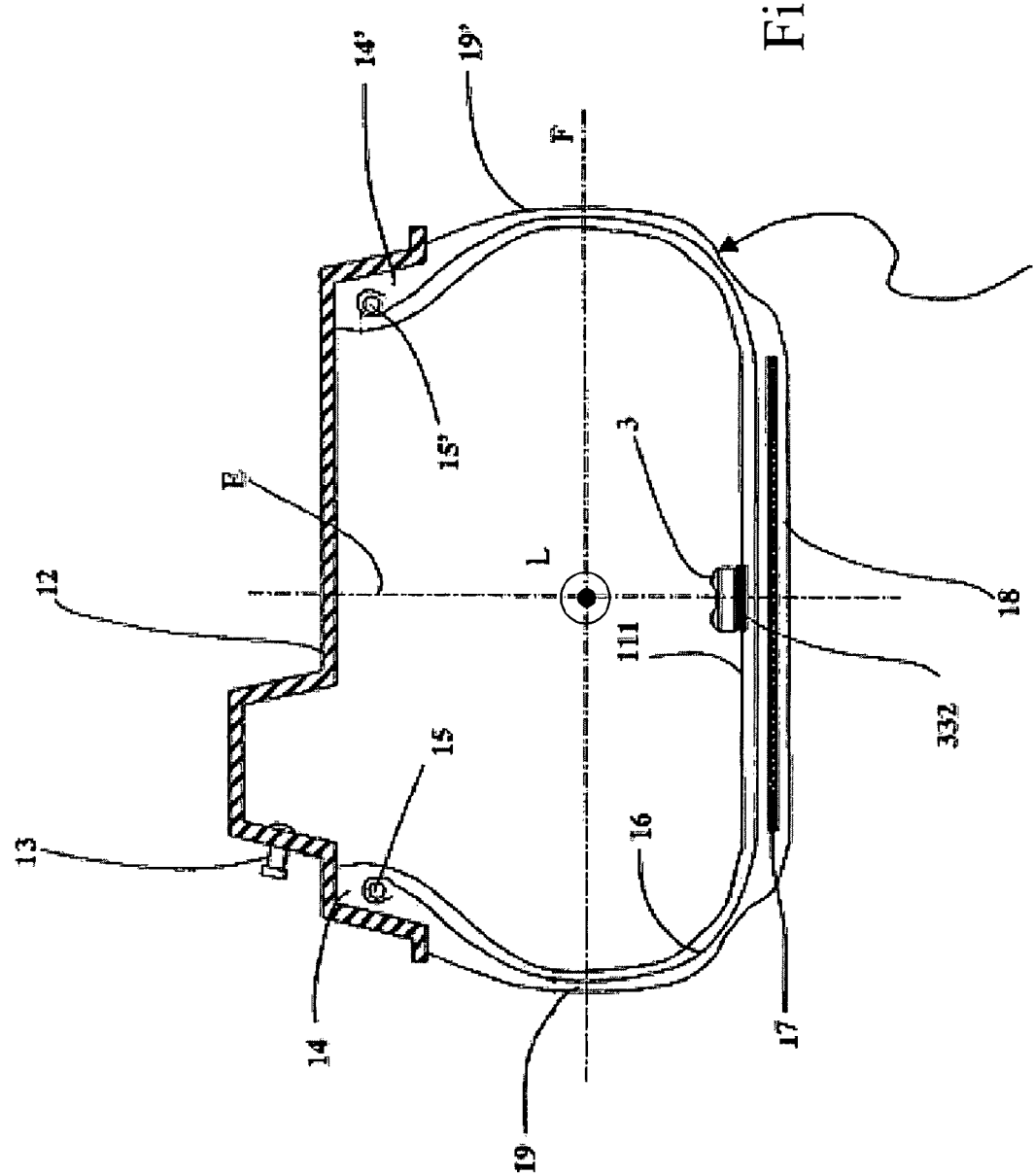
FIG. 1 shows a cross section of an exemplary tyre comprising a sensor device according to the invention.

FIG. 1 shows a cross section of a wheel comprising a tyre 11 and a supporting rim 12. The tyre 11 shown in FIG. 1 is of a type conventionally known as "tubeless", i.e. it does not include an inner tube. This tyre can be inflated by means of an inflation valve 13 fitted on the said rim 12.

The tyre 11 includes a carcass 16, terminating in two beads 14 and 14', each formed along an inner circumferential edge of the carcass 16, for fixing the tyre 11 to the supporting rim 12. The beads 14, 14' comprise respective reinforcing annular cores 15 and 15', known as bead cores. The carcass 16 is formed by at least one reinforcing ply, including textile or metallic cords, extending axially from one bead 14 to the other 14' in a toroidal profile, and having its ends associated with a respective bead core 15 and 15'. In tyres of the type known as radial, the aforesaid cords lie essentially in planes containing the axis of rotation of the tyre. An annular structure 17, known as belt structure, is placed in a radially external position with respect to the carcass 16. Typically, the belt structure 17 includes one or more strips of elastomeric material incorporating metal and/or textile cords, overlapping with each other. A tread band 18 is wound around the belt structure 17 for the rolling contact of the tyre with the ground. The tread band is typically impressed with a relief pattern. Two sidewalls 19 and 19', each radially extending outwards from the outer edge of the corresponding bead 14 and 14', are also placed on the carcass 16 in axially opposed lateral positions. In tubeless tyres the inner surface of the carcass 16 is normally covered with a liner 111, i.e. with one or more layers of air-impermeable elastomeric material. Other known elements, such as for example bead fillers may be provided, according to the specific design of the tyre 11.

A sensor device 3 is included within the tyre 11. The sensor device 3 is coupled to a tyre portion corresponding to a tread area of the tyre 11, i.e. in a portion located in the region of the tyre 11 axially extending between the sidewalls of the tyre 11. Preferably, the sensor device is disposed substantially in correspondence of the equatorial plane of the tyre 11. In the preferred embodiment shown in FIG. 1, the sensor device 3 is secured to the inner liner 111 of the tyre 11. A fixing element 332 adheres both to the sensor device 3 and to the inner liner 111. The fixing element 332 provides the securing of the sensor device 3 to the inner liner 111 of the tyre, and is adapted to comply with the deformations undergone by the tyre structure during rolling, in order to stably maintain such sensor securing.

A preferred embodiment of a fixing element 332 adapted for maintaining stable securing of the sensor device 3 to the tyre is described in the PCT patent application no. 2006WO-EP003844 in the name of the Applicant, which is incorporated herein by reference. In such embodiment the fixing element (named "anchoring body" in PCT patent application 2006WO-EP003844) comprises at least two portions made of an elastomeric material. Each portion has a fastening surface, to be secured to the internal surface of the tyre 11, and a retaining sub-portion. The sensor 3 is arranged between the two retaining portions. An antenna having an annular shape and being associated with the sensor (see below) may be disposed in a groove formed between the fastening surface and the retaining sub-portion of each portion, so that the engagement between the inner perimetral edge of the antenna and the groove formed in each portion maintains a constraint between the sensor 3 and the fixing element 332.

In alternative embodiments, the sensor device 3 may be incorporated within the structure of the tyre in the tread area, for example within the tread band, or between the outer belt strip and the tread band.

Figure 2:
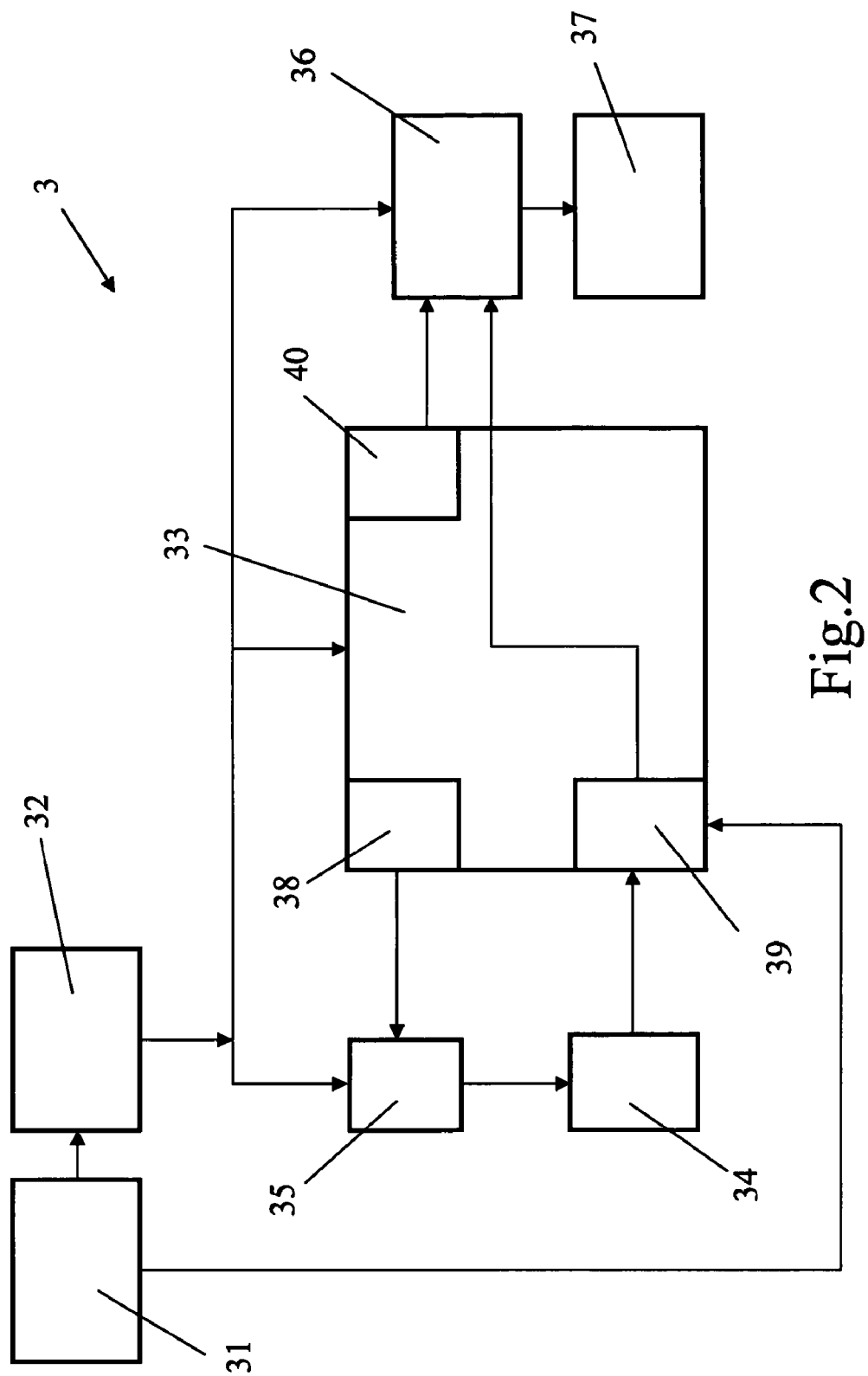
FIG. 2 shows an exemplary scheme of a sensor device to be included in the tyre of FIG. 1.

A scheme of an exemplary sensor device 3 is shown in FIG. 2. The sensor device 3 comprises a power supply 31, a microcontroller 33, a measurement device 34, a radio-frequency transmitter 36, an antenna 37.

The power supply 31 comprises a flexible piezoelectric element, as it will be described in detail in the following, which deforms under the forces transmitted to it by the tyre during rolling on the road. Due to piezoelectric effect, such deformations generate electrical charge, which can be collected by suitable electrodes and fed to a voltage preparation circuit 32, typically including a diode rectifier bridge (not shown), being adapted to transform an alternate current in a direct current. The voltage preparation circuit 32 also includes a capacitor (not shown), suitable for storing the electrical charge generated by piezoelectric effect. The voltage preparation circuit 32 may also comprise a voltage controller (not shown), being adapted to verify that a voltage across the capacitor is above a predetermined minimum voltage (e.g. 2.7 Volt).

The electrical power generated by the power supply 31 and stored in the voltage preparation circuit 32 is fed to the micro-controller 33, to the measurement device 34 (via switch 35) and to the radio-frequency transmitter 36.

Furthermore, the electrical signal generated by the deformations of the flexible piezoelectric element is also directly fed towards the micro-controller 33, in order to allow an analysis of the same devoted to the extraction of information related to some operating parameters of the tyre, such as the length of the contact region between the tyre and a rolling surface and/or the load to which the tyre is subjected.

The measurement device 34 comprises sensors adapted to measure operating parameters of the tyre to be monitored, such as for example pressure and/or temperature. An accelerometer could also be provided as measurement device. The measurement device 34 also includes control circuitry adapted to transform the sensed measurements in electrical.

The radio-frequency transmitter device 36 is adapted to transmit, via the antenna 37, information frames containing the measured parameter or parameters, to a receiver (not shown) external to the tyre, typically located on the vehicle to which the tyre is fit.

The micro-controller 33 typically comprises a CPU that controls operation of the sensor device 3. In the preferred embodiment shown in FIG. 2, the micro-controller 33 enables, via a first timing/enabling circuit 38, the switch 35 to close the circuit towards the measurement device 34, in order to energize the same for carrying out the measurement of the characteristic parameter or parameters to be monitored. Furthermore, the micro-controller 33 enables, via a second timing/enabling circuit 40, the transmission of the frames to the external receiver. Moreover, the micro-controller 33 collects the signals coming from the power supply 31 and from the measurement device 34, and processes the signals, via an analysis circuit 39, in order to extract the information to be sent outside the tyre via the radio-frequency transmitter 36. For the purposes of the present invention, the term "circuit" referred to the first timing/enabling circuit 38, to the analysis circuit 39, to the second timing/enabling circuit 40 should not be construed in a limiting way: in order to perform the associated function, the circuits 38, 39, and 40 could be realized either in hardware (by suitable electronics), or in software (by suitable program routines), or in a combination of hardware and software.

The enabling of the closure of the switch 35, as well as the enabling of the frame transmission by transmitter 36, may be performed at predetermined time intervals.

For example, the first timing/enabling circuit 38 may drive the closure of the switch 38 every two minutes, whereas the second timing/enabling circuit 40 may enable transmission of collected data to the outside every seven minutes, since radio-frequency transmission typically requires more power with respect to parameter measurements.

As another example, the closure of the switch 38 and/or the transmission of collected data may be enabled when the voltage across the capacitor included in the voltage preparation circuit 32 is above a predetermined threshold voltage. The first and/or second timing/enabling circuits 38, 40 may be realized in any conventional manner, as hardware circuits separate from the micro-controller 33, or as firmware objects integrated within the memory of the micro-controller 33.

Figure 3:
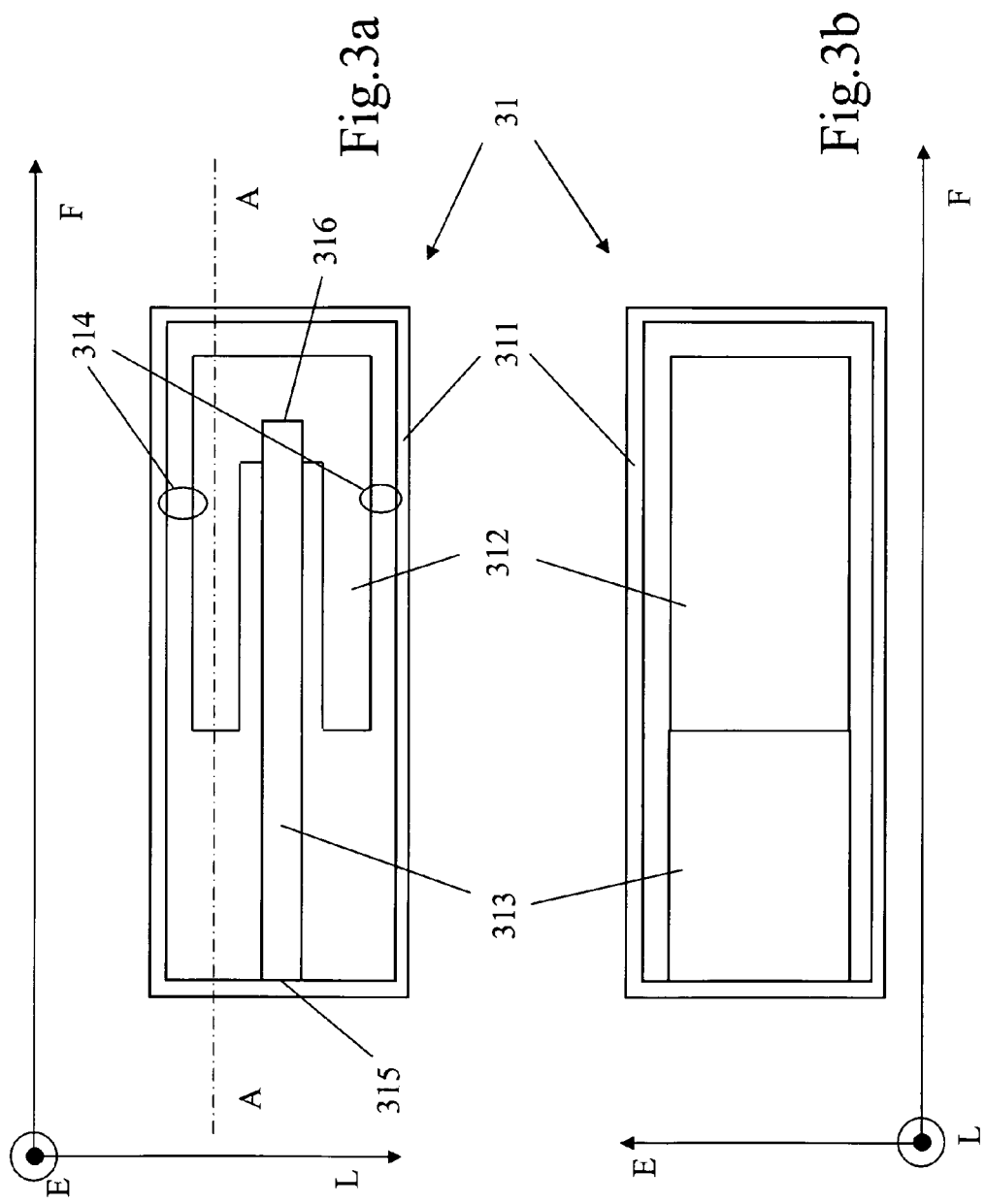
FIGS. 3a and 3b show an exemplary flexible piezoelectric element to be included in the sensor device of FIG. 2 for power supply.

FIG. 3*a* shows a cross-section of a power supply 31 according to one embodiment of the invention. The power supply 31 comprises a housing 311, a flexible piezoelectric element 313 and a loading mass 312 associated to the piezoelectric element. FIG. 3*b* shows a view of the power supplier along the section indicated as A-A in FIG. 3*a*.

With reference to FIG. 3*a*, the flexible piezoelectric element 313 is disposed within the housing in cantilever-beam fashion. In other words, the flexible piezoelectric element 313 is fixed at a first end 315 thereof to the housing 311, whereas the second end 316 is associated to the loading mass 312. The flexible piezoelectric element is preferably formed as a planar element. Alternatively, it can be formed as a bar element. In preferred embodiments, a planar piezoelectric element comprises at least two planar piezoelectric crystals, separated by a planar, electrically conductive (e.g., metallic) plate (bimorph configuration). Electrodes are conventionally disposed on the outer surfaces of the piezoelectric elements.

The power supply 31 is coupled to the tyre so as to substantially match the oscillation direction of the flexible piezoelectric element 313 with a longitudinal (or circumferential) direction of the tyre (indicated as "L" in FIGS. 1, 3*a*, 3*b*). In such way, the flexible piezoelectric element 313 and the associated loading mass 312 are subjected, during rolling of the tyre, to the longitudinal acceleration. In order to uniformly distribute the stress undergone by the flexible piezoelectric element 313, the longer side of the piezoelectric element 313 may be preferably disposed substantially according to an axial direction of the tyre (indicated as "F" in FIGS. 1, 3*a*, 3*b*), i.e. a direction parallel to the rotation axis of the tyre.

The geometrical dimensions of the flexible piezoelectric element 313, of the loading mass 312 and of the housing 311 are chosen so as to leave an interspace 314, also called "gap", between the outer surface of the loading mass 312 and at least one of the inner walls of the housing 311. The gap defines a maximum deflection allowed to the flexible piezoelectric element 313. In order to limit the dimensions of the power supply 31 and to shift the center of mass of the structure comprising the flexible piezoelectric element and the loading mass substantially at the free end of the flexible piezoelectric element 313, the loading mass 312 may preferably be U-shaped, as shown in FIG. 3*a*.

Figure 4:
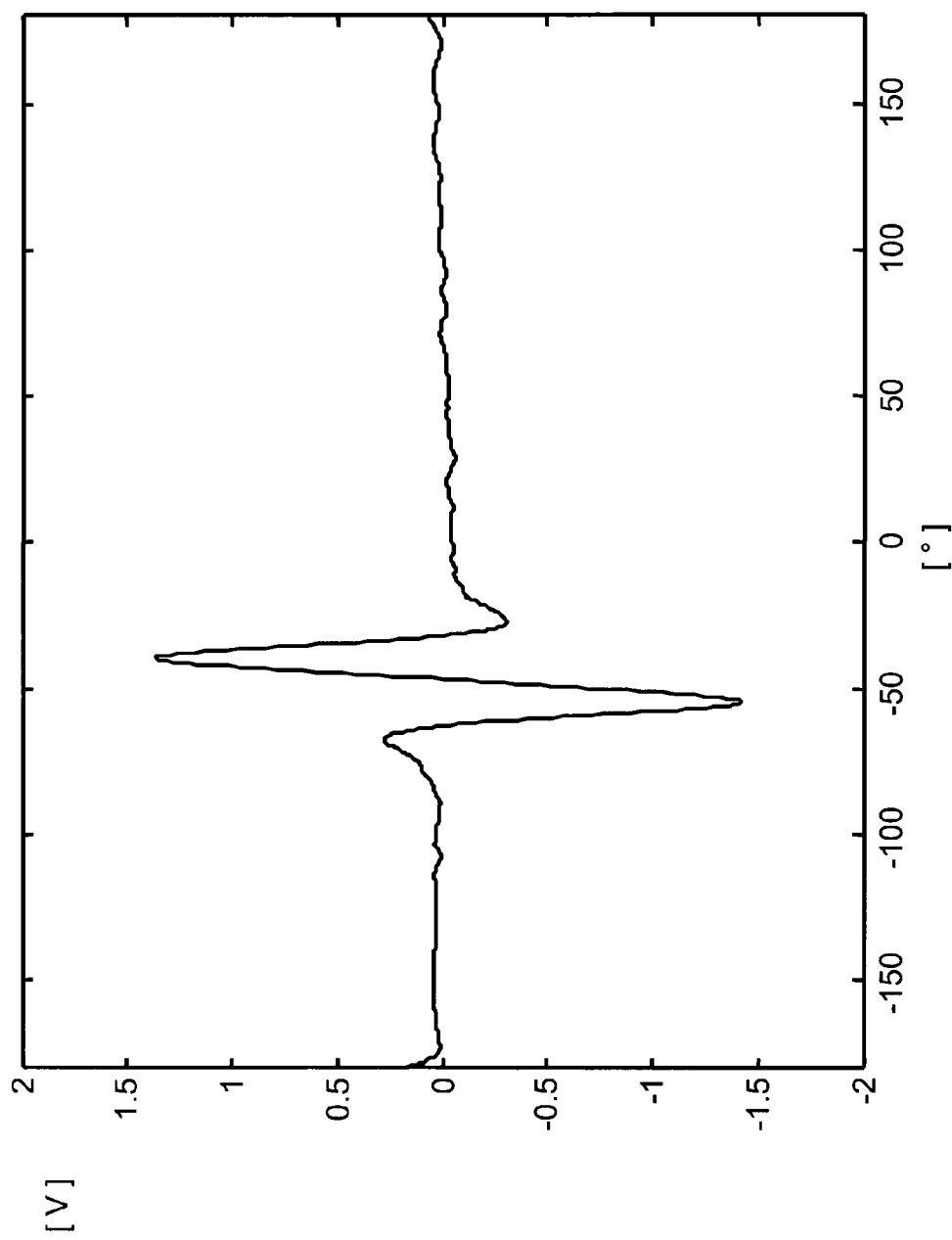
FIG. 4 shows a typical signal related to the longitudinal acceleration to which a crown portion of a tyre is subjected during one tyre revolution.

In operation, the power supply 31 is subjected to the forces/accelerations which develop due to the tyre rotation. The centrifugal acceleration is particularly high, but is also mixed with other acceleration contributions that come from the interaction of the tyre with the ground during rolling, and that generally have a lower intensity with respect to the centrifugal acceleration contribution (particularly at high speed). In particular, an acceleration contribution in the longitudinal direction of the tyre (i.e. the circumferential direction) is imparted to tyre portions entering and exiting from the contact region between the tyre and the rolling surface (or contact patch) at any tyre revolution. FIG. 4 shows an exemplary profile of a signal describing a longitudinal acceleration to which a tyre portion associated to the power supply 31 may be subjected during a tyre revolution.

With reference to FIG. 4, in a first fraction of a complete tyre revolution, during which the tyre crown portion associated with the power supply 31 is not in contact with the ground, the longitudinal acceleration is substantially null (if a constant rotation speed is considered), except for the high frequency oscillations visible in FIG. 4, the presence of which is due to vibrations imparted to the tyre structure as an effect of the interaction with the ground.

In a second fraction of a complete tyre revolution, during which the tyre crown portion associated with the power supply 31 is in contact with the ground, the longitudinal acceleration level shows two well defined and characteristic peaks having opposite sign, substantially corresponding to the entering and the exiting of the tyre portion associated with the power supply 31 into/from the contact patch. The exact disposition sequence of the two peaks (first positive peak and second negative peak or vice versa) depends on the rotation direction of the tyre.

Due to the disposition of the power supply 31 in the tyre disclosed above with reference to FIGS. 3a, 3b, the structure comprising the flexible piezoelectric element 313 (and the loading mass 312) is subjected to the action of the "impulse" longitudinal acceleration shown in FIG. 4. In practice, each time the tyre crown portion associated with the power supply 31 enters into and exits from the contact patch the structure comprising the flexible piezoelectric element 313 (and the loading mass 312) receives an acceleration impulse (corresponding to the positive and negative peaks shown in FIG. 4), causing the structure to oscillate. In rectilinear driving conditions and at constant speed, substantially no other longitudinal acceleration contributions having intensity comparable to that of the peaks shown in FIG. 4 will disturb or stop the oscillation of the structure, so that in the remaining portion of tyre revolution outside the contact patch the structure may be substantially free to oscillate. In summary, the structure comprising the flexible piezoelectric element 313 and the loading mass 312 behaves as a forced oscillator, enabled to substantially freely oscillate in the longitudinal direction of the tyre when the crown portion associated with the power supply 31 is outside the contact patch, and receiving an impulse force (of opposite sign) at each entering into and exiting from the contact patch.

It is noticed that this behavior is totally different from that obtained by disposing the power supply 31 so as to match an oscillation direction of the structure comprising the flexible piezoelectric element 313 and the loading mass 312 with a radial direction of the tyre, in which the oscillation practically occurs only during passage of the tyre portion associated with the power supply in the contact patch (at a rotation speed higher than a certain threshold), as shown in the above mentioned patent application WO 2005/067073.

Due to the lower intensity of the longitudinal acceleration peaks shown in FIG. 4 with respect to the values reachable in the radial direction (at the same rotation speed), the loading mass 312 is pushed away from its equilibrium position by the longitudinal acceleration to a lower displacement with respect to that obtainable with the centrifugal acceleration, so that the overall excursions of the oscillations of the structure comprising the flexible piezoelectric element 313 and the loading mass 312 are correspondingly lower. However, since the structure comprising the flexible piezoelectric element 313 and the loading mass 312 substantially behaves as a free oscillator when the associated tyre portion is outside the contact patch, deformation of the flexible piezoelectric element 313 may continue during the whole tyre revolutions, continuously generating electric charge. It is also observed that resonance phenomena may also occur in certain rotation speed ranges, in particular due to higher order harmonic contributions: in such cases, the excursion of the forced oscillation may occur to grow up to the maximum allowed by the gap 314, with a maximum generation of electric charge.

Figure 5:
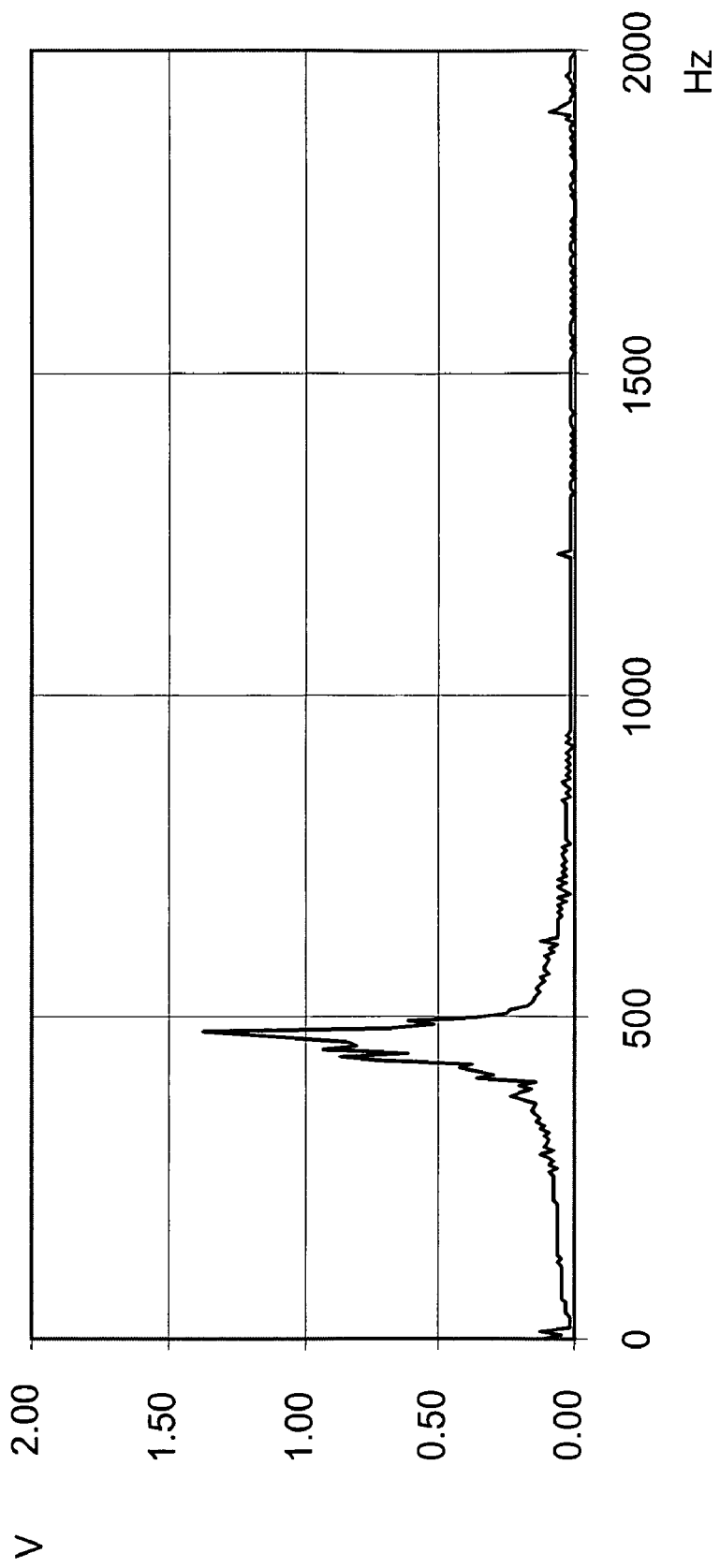
FIG. 5 shows an exemplary frequency response of the flexible piezoelectric element of FIGS. 3a and 3b.

FIG. 5 shows the frequency response of an exemplary flexible piezoelectric element 313 associated with a loading mass 312. The dimensions and material of the piezoelectric element 313 were chosen so as to obtain a stiffness k thereof of about 4800 N/m. The loading mass 312 $m$ was sized to about 0.6 grams. In order to obtain the frequency response, the housing comprising the piezoelectric element associated to the loading mass was disposed on a shaker device driven by a control electronics, which applied a pulsed exciting force to the shaker, in a frequency range between 0 Hz and 2000 Hz. The movement of the shaker caused oscillations of the loading mass and of the piezoelectric element, with consequent generation of electric charge. FIG. 5 reports the transfer function of the oscillating structure, versus the frequency the exciting force. As it can be seen from FIG. 5, a resonance peak of the structure formed by the piezoelectric element and by the loading mass is between 300 Hz and 600 Hz, with a maximum at around 450 Hz.

Figure 6:
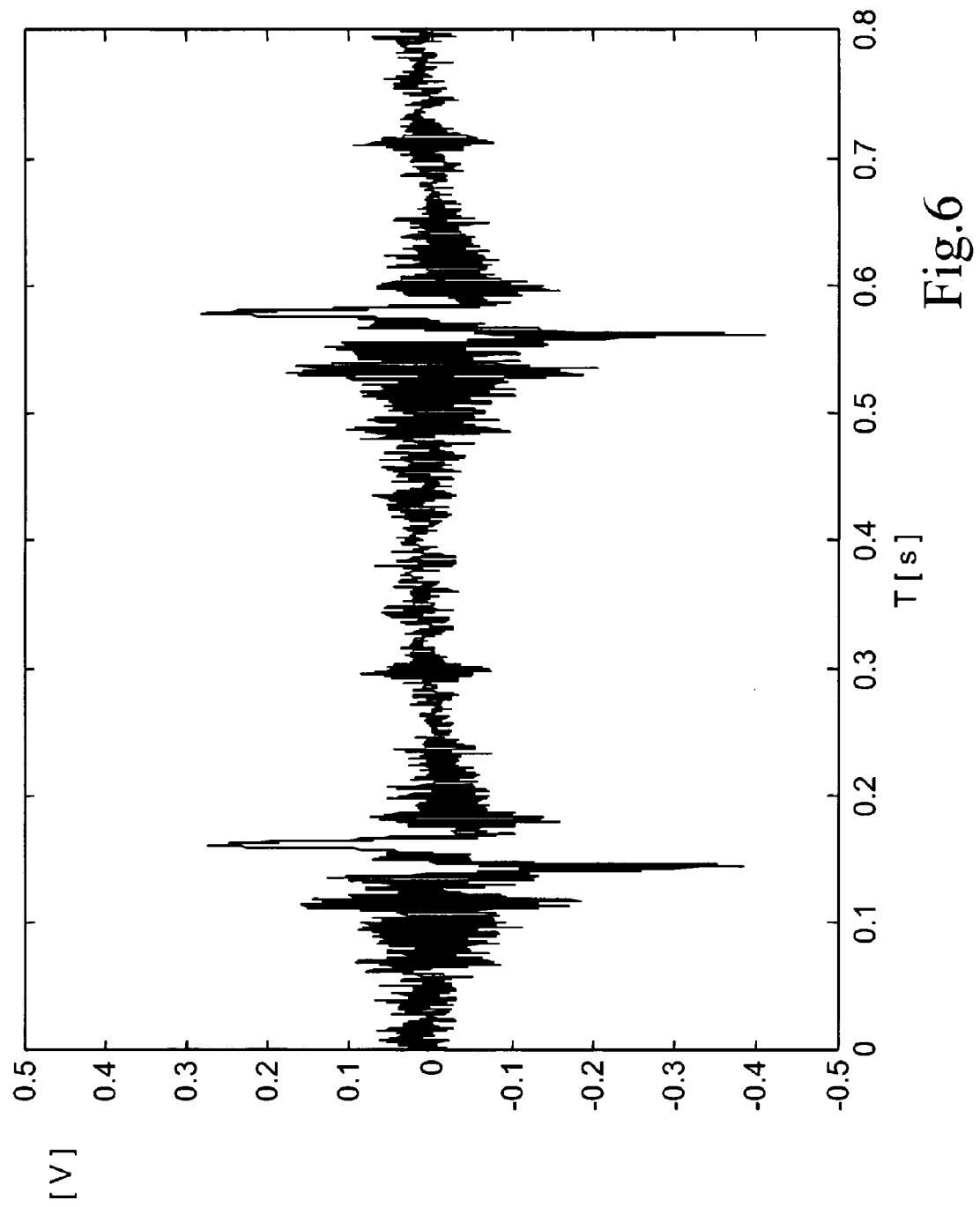
FIG. 6 shows a signal obtained from the flexible piezoelectric element of FIGS. 3a and 3b mounted on a tyre rotating at a speed of 17 km/h.
Figure 7:
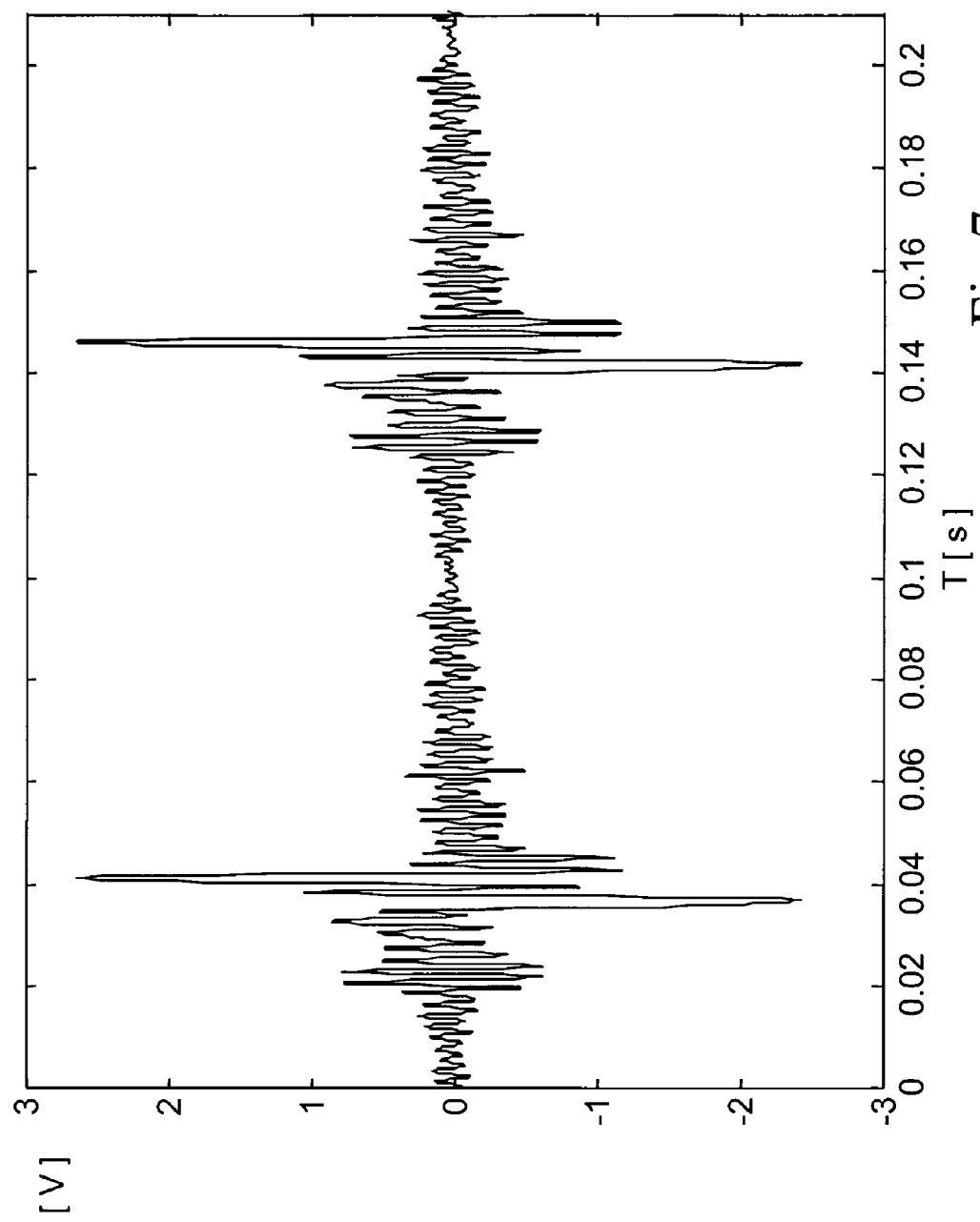
FIG. 7 shows a signal obtained from the flexible piezoelectric element of FIGS. 3a and 3b mounted on a tyre rotating at a speed of 68 km/h.

FIG. 6 and FIG. 7 show the voltage signal versus time generated by a power supply coupled to the inner liner of a tyre as disclosed above. The power supply was formed by including a bimorph plate of piezoelectric material (PZT), having a width of 4.5 mm, a length of 11 mm, an overall thickness of 0.46 mm in a plastic housing having width of 7 mm, a length of 12 mm, a height of 6.2 mm, a thickness of 1 mm. A loading mass of 0.6 gr. was fixed to the free end of the piezoelectric plate. An overall gap of 200 μm was left between the inner walls of the housing and the outside surface of the loading mass (100 μm+100 μm).

FIG. 6 shows the voltage signal versus time obtained by such power supply when the tyre rotated at 15 rad/s. A number of stronger voltage characteristic oscillation peaks are visible, corresponding to the passages of the tyre crown portion associated with the power supply under the contact patch, with a superimposed continuum of smaller voltage oscillations extending across the whole time interval. Voltage oscillations are due to actual oscillations of the piezoelectric plate, that occur both when the tyre portion associated to the power supplier is outside the contact patch, and when the tyre portion associated to the power supplier is within the contact patch.

FIG. 7 shows the voltage versus time obtained by the power supply when the tyre rotates at 60 rad/s. As it can be seen, the behavior is substantially similar to that of FIG. 6, with stronger characteristic oscillation peaks superimposed to a continuum of smaller oscillation peaks. However, both the stronger and the smaller oscillation peaks reach higher values of generated voltage with respect to those visible in FIG. 6.

The Applicant has verified that a power supply prepared as shown in FIG. 3a, 3b, associated with a crown portion of a tyre as explained above, allows obtaining a sufficient electrical power for supplying common sensor devices to be included within a tyre for a monitoring of its operating parameters. In particular, a high quantity of electrical charge can be generated at all speeds, due to substantially continuous oscillation of the flexible piezoelectric element. This is shown by the graph of FIG. 8, in which three curves obtained in a series of tests performed by the Applicant are represented. The three curves of FIG. 8 show the electrical energy stored in a capacitor of 100 μF connected (via a rectifier diode bridge) to the exemplary power supply described above with reference to FIGS. 6 and 7, versus time. A load resistance of 3.3 MΩ was connected across the capacitor. The power supply was disposed on a shaker device to which actual acceleration signals obtained from a tyre rotating at a speed of 20 km/h, 40 km/h, 60 km/h were applied. As it can be seen, the higher the rotation speed, the higher the stored electrical energy.

A great reliability of the power supply has been also verified by the Applicant. The Applicant believes that this may depend on the fact that the flexible piezoelectric element flexes under the action of forces developed in the longitudinal of the tyre, which are, on average, very small, and, in any case, much lower than the forces developed in the radial direction of the tyre (particularly at high speed).

Possible large oscillations occurring as a consequence of the passage of the tyre crown portion associated with the power supply under the contact patch may be limited with a suitable dimensioning of the gap between the inner walls of the housing and the outer surface of the loading mass. Thus, a strong reduction of the occurrence of cracks and breakings within the piezoelectric material may be obtained.

Advantageously, in order to reduce the occurrence of resonant modes of the oscillating structure forming the power supply, the various components of the power supply may be dimensioned so as to obtain a resonance frequency of the piezoelectric element+loading mass structure higher than 150 Hz, preferably higher than 200 Hz, more preferably higher than 300 Hz. The Applicant believes that such choice allows to further increase the reliability of the power supplier, since large resonant oscillations of the piezoelectric element are substantially avoided during tyre rotation (at least for the first order harmonic contribution), in any practical speed condition.

Exemplary preferred ranges for a power supply using a bimorph PZT piezoelectric plate for obtaining the above explained performance may be the following:

length of the PZT plate: from 7 to 20 mm;
width of the PZT plate: from 3 to 18 mm;
overall thickness of the bimorph plate: from 0.15 to 1.20 mm;
loading mass: from 0.05 gr to 4 gr
gap: from 50 to 400 µm.

With particular reference to the loading mass size, it has to be noticed that a low size of the loading mass allows to increase the resonance frequency of the piezoelectric element+loading mass structure. Furthermore, a low size of the loading mass allows reducing an unbalancing caused to the tyre rotation due to the presence of the power supply. Moreover, a low size of the loading mass allows reducing the occurrence of cracks and breakings in the power supplier housings caused by the hits against the inner walls during oscillation. However, a too low size of the loading mass does not allow sufficient bending of the piezoelectric element, with consequent insufficient generation of electrical charge. A guideline for the dimensioning of the power supplier could be to choose a loading mass size m sufficient to substantially avoid unbalancing of the tyre during rotation (e.g. a mass lower than 4 gr.), to choose a resonance frequency $f_r$ for the piezoelectric element+loading mass structure (e.g. higher than 150 Hz) and then derive the dimensions of the piezoelectric element from its stiffness k, calculated by inverting the following well known relationship:

$$f_r = \frac{1}{2\pi}\sqrt{\frac{k}{m}}$$

The Applicant has also verified that the electrical signal provided by the power supply 31 arranged as disclosed above with reference to FIGS. 3a, 3b could be advantageously exploited not only for providing electrical energy, but also for obtaining some operating parameters of the tyre, such as its fitting position (i.e. right hand side or left hand side) on the vehicle, and/or the length of the contact patch, and/or the load to which the tyre is subjected, and/or the number of tyre revolutions occurred within a given time interval.

For such purpose, referring back to FIG. 2, the electrical signal generated by the power supply 31 is fed to the microcontroller 33, and particularly to an analysis circuit 39. The analysis circuit 39 performs a processing of the electrical signal aimed at the extraction of information related to its characteristic peaks related to the entering into or the exiting from the contact patch of the crown portion coupled to the power supply 31, i.e. the maximum and the minimum peaks well visible in FIG. 4 and well reproduced in the signals plots of FIGS. 6 and 7. These characteristic peaks could be detected by methods well known to the skilled in the art, e.g. by comparing the electrical signal with one or more fixed or adaptive thresholds.

In order to estimate the length of the contact patch, the distance between predetermined points of the characteristic peaks could be detected. Typically, these predetermined points could correspond to the maximum value and to the minimum value respectively obtained in the positive and in the negative peak, or points disposed at a predetermined distance with respect to the maximum and the minimum. The load to which the tyre is subjected could also be derived, by using the estimated length of the contact patch and by knowing the pressure to which the tyre is inflated, exploiting known relationships relating the load, the pressure and the length of the contact patch. Patent Application no. WO05/042281 in the name of the Applicant (the content of which is herein incorporated by reference) describes a more precise method for determining the load which could also be used, once the length of the contact region between the tyre and the road surface has been estimated.

Another important parameter detectable by analyzing the electrical signal generated by the power supply 31 is the fitting position of the tyre containing the power supply 31 on the vehicle. In other words, by simple analysis of the electrical signal generated by the power supply 31, the sensor 3 can "auto-locate" itself as being fitted in the right hand side or in the left hand side of the vehicle. In order to extract this information, the sequence of the signs of the above mentioned characteristic peaks could be detected. In fact, as said before with reference to FIG. 4, the positive-negative or negative-positive sequence of the peaks of the longitudinal acceleration representing the entering into or the exiting from the contact patch depends on (and can thus be used as an indication of) the rotation versus of the tyre. Taking the external of a vehicle as a reference, right hand side tyres rotate clockwise, while left hand side tyres rotate counter-clockwise. Since the power supply 31 is sensitive to the longitudinal acceleration, the clockwise or counter-clockwise rotation of a tyre (i.e. its fitting position on the vehicle) containing the power supply 31 could be found based on the detection of the sequence of signs of the positive and negative characteristic peaks representing the entering into and the exiting from the contact patch (assuming that the power supply 31 is applied in the right hand side and in the left hand side tyres in the same predetermined way, e.g. with the oscillating end of the flexible piezoelectric element pointing towards the inner sidewall of the tyre). For example, the detection of the fact that the positive peak (derivable by extracting the sign of the maximum signal value) precedes the negative peak (derivable by extracting the sign of the minimum signal value) could correspond to clockwise rotation. Such detection could be performed by suitable processing of the electrical signal performed at the processing device 33 (via its analysis circuit 39).

In order to count the number of tyre revolutions performed by said tyre during rolling in a given time period, one of the characteristic peaks could be used as a reference to be detected in each tyre revolution within the time period. By counting the occurrences of the chosen characteristic peak, the number of tyre revolutions could be evaluated.

The invention claimed is:

1. A method for generating electrical energy within a tyre, comprising:
    providing an oscillating structure comprising a housing and a piezoelectric element coupled to said housing and being able to oscillate in an oscillation direction;
    coupling said oscillating structure to a crown portion of said tyre;
    rotating said tyre on a rolling surface so as to cause oscillation of said piezoelectric element, thereby leading to a deformation of said piezoelectric element during the tyre rotation; and
    storing electrical energy generated from said deformation of said piezoelectric element,
    wherein said coupling of said oscillating structure to a crown portion of said tyre is performed so as to substantially match said oscillation direction with a longitudinal direction of the tyre.

2. The method according to claim 1, wherein said piezoelectric element is coupled to said housing so as to have a first end substantially fixed to the housing and a second end fixed to a loading mass.

3. The method according to claim 2, wherein a gap is formed between at least one inner wall of said housing and an outer surface of said loading mass.

4. The method according to claim 1, wherein said crown portion of said tyre is a portion of the inner surface of the tyre.

5. The method according to claim 1, wherein said coupling of said oscillating structure to said crown portion of the tyre is performed so as to dispose a longer side of said piezoelectric element substantially according to an axial direction of the tyre.

6. A system for generating electrical energy comprising:
    a tyre;
    an oscillating structure coupled to a crown portion of said tyre, comprising a housing and a piezoelectric element coupled to said housing and configured to oscillate in an oscillation direction so as to generate electrical energy upon oscillation; and
    a storing circuit configured to store said electrical energy, coupled to said oscillating structure,
    wherein said oscillating structure is coupled to said crown portion of said tyre so as to substantially match said oscillation direction with a longitudinal direction of the tyre.

7. The system of claim 6, wherein said piezoelectric element is disposed within said housing so as to have a first end substantially fixed to the housing and a second end fixed to a loading mass.

8. The system according to claim 7, wherein said loading mass is less than 4 grams.

9. The system according to claim 7, wherein said loading mass is U-shaped.

10. The system according to claim 7, wherein a gap is formed between of least one inner wall of said housing and an outer surface of said loading mass.

11. The system according to claim 10, wherein said gap has an overall maximum extent of 400:m.

12. The system according to claim 6, wherein said crown portion of said tyre is a portion of an inner surface of the tyre.

13. The system according to claim 6, wherein said oscillating structure is coupled to said crown portion of the tyre so as to dispose a longer side of said piezoelectric element substantially according to an axial direction of the tyre.

14. The system according to claim 6, wherein a resonance peak frequency of said oscillating structure is greater than 150 Hz.

15. The system according to claim 14, wherein said resonance peak frequency is greater than 200 Hz.

16. The system according to claim 15, wherein said resonance peak frequency is greater than 300 Hz.

17. The system according to claim 6, wherein said piezoelectric element is a bimorph element.

18. The system according to claim 6, wherein said piezoelectric element is a planar element.

19. The system according to claim 6, wherein said storing circuit comprises a capacitor.

20. A system for monitoring at least one operating parameter of a tyre fitted on a vehicle, comprising:
    a system for generating electrical energy according to claim 6; and
    a processing device capable of being adapted to process electrical signals generated by the piezoelectric element so as to determine said at least one operating parameter of the tyre.

21. The system according to claim 20, wherein said processing device is capable of being adapted to process said electrical signals so as to extract information related to characteristic peaks of said electrical signals, said characteristic peaks being related to an entering of the crown portion coupled to the oscillating structure in a contact region between the tyre and a rolling surface, and to an exiting of the crown portion coupled to the oscillating structure from said contact region.

22. The system according to claim 21, wherein said information related to said characteristic peaks comprises a distance between predetermined points of said characteristic peaks.

23. The system according to claim 21, wherein said information related to said characteristic peaks comprises a sequence of signs of said characteristic peaks.

24. The system according to claim 23, wherein said at least one operating parameter of the tyre comprises a fitting position of the tyre on the vehicle, and wherein said processing device is capable of being adapted to determine said fitting position of the tyre based on said sequence of signs.

25. The system according to claim 21, wherein said at least one operating parameter of the tyre comprises a number of tyre revolutions performed by said tyre during rolling in a given time period, and wherein said processing device is capable of being adapted to determine said number of tyre revolution, by counting an occurrence of one of said characteristic peaks during said given time period.

26. The system according to claim 20, further comprising a measurement device of at least a further operating parameter of the tyre, the measurement device being coupled to said system for generating electrical energy and to said processing device.

27. The system according to claim 26, wherein said measurement device comprises a pressure sensor.

28. The system according to claim 22, wherein said at least one operating parameter of the tyre comprises a load to which the tyre is subjected, and wherein said processing device is capable of being adapted to determine said load based on said distance between said predetermined points of said characteristic peaks and a pressure measured by said pressure sensor.

29. The system according to claim 26, wherein said measurement device comprises a temperature sensor.

30. The system according to claim 26, wherein said measurement device comprises an acceleration sensor.

31. The system according to claim 20, further comprising a transmitter device coupled to said system for generating electrical energy
and to said processing device, the transmitter device capable of being adapted to transmit said at least one operating parameter or said at least one further operating parameter to a receiving device disposed on said vehicle.

* * * * *

UNITED STATES PATENT AND TRADEMARK OFFICE
CERTIFICATE OF CORRECTION

PATENT NO. : 8,387,452 B2
APPLICATION NO. : 12/452662
DATED : March 5, 2013
INVENTOR(S) : Brusarosco et al.

Page 1 of 1

It is certified that error appears in the above-identified patent and that said Letters Patent is hereby corrected as shown below:

In the Claims

Claim 10, col. 13, line 58, "of least" should read as --at least--.

Signed and Sealed this
Ninth Day of July, 2013

Teresa Stanek Rea
*Acting Director of the United States Patent and Trademark Office*